United States Patent
Ritland et al.

(10) Patent No.: US 6,338,906 B1
(45) Date of Patent: Jan. 15, 2002

(54) METAL-INFILTRATED CERAMIC SEAL

(75) Inventors: Marcus A. Ritland, Golden; William Todd Howe, Arvada, both of CO (US)

(73) Assignee: CoorsTek, Inc., Golden, CO (US)

(*) Notice: Subject to any disclaimer, the term of this patent is extended or adjusted under 35 U.S.C. 154(b) by 0 days.

(21) Appl. No.: 09/438,202

(22) Filed: Nov. 11, 1999

Related U.S. Application Data

(63) Continuation-in-part of application No. 08/949,227, filed on Oct. 13, 1997, now Pat. No. 6,143,421, which is a continuation-in-part of application No. 08/820,164, filed on Mar. 19, 1997, and a continuation-in-part of application No. 08/220,558, filed on Mar. 31, 1994, now Pat. No. 5,700,373, and a continuation-in-part of application No. 08/220,560, filed on Mar. 31, 1994, now Pat. No. 5,676,907, which is a division of application No. 08/220,570, filed on Mar. 31, 1994, now Pat. No. 5,614,043, each is a continuation-in-part of application No. PCT/US93/08835, filed on Sep. 17, 1993, which is a continuation-in-part of application No. 07/946,972, filed on Sep. 17, 1992, now abandoned.

(51) Int. Cl.[7] .................. B32B 31/26; B22D 19/00; B22F 3/11; C04B 35/02
(52) U.S. Cl. ............... 428/539.5; 428/614; 501/96.3; 501/127; 277/650; 277/651
(58) Field of Search ............... 428/614, 539.5; 501/127, 96.3, 88; 277/650, 651; 384/912, 913, 907.1

(56) References Cited

U.S. PATENT DOCUMENTS

| | | |
|---|---|---|
| 2,612,443 A | 9/1952 | Goetzel et al. |
| 3,310,427 A | 3/1967 | Cheney et al. |
| 3,624,809 A | 11/1971 | Beninga ............... 277/92 |
| 3,643,967 A | 2/1972 | Stahl ..................... 277/92 |
| 3,718,441 A | 2/1973 | Landingham ........ 29/182.1 |
| 3,864,154 A | 2/1975 | Gazza et al. ............ 29/123 B |
| 3,868,267 A | 2/1975 | Gazza et al. ........... 117/22 |

(List continued on next page.)

FOREIGN PATENT DOCUMENTS

EP 197694 10/1986

OTHER PUBLICATIONS

U.S. application No. 08/820,164, Ritland et al., filed Mar. 19, 1997.

U.S. application No. 08/949,227, Ritland et al., filed Oct. 13, 1997.

U.S. application No. 09/184,790, Ritland et al., filed Nov. 2, 1998.

Chaklader et al., "Interface Reactions Between Metals and Ceramics: IV, Wetting of Sapphire by Liquid Copper–Oxygen Alloys" Dept. of Metallurgy, Univ. of British Columbia, Vancouver, British Columbia, Canada (Date and publication unknown).

Goetzel, "Infiltration," *Metal Handbook*, (Powder Metallurgy) 7:551–566 (1984) (No month).

(List continued on next page.)

*Primary Examiner*—Deborah Jones
*Assistant Examiner*—Jason Savage
(74) *Attorney, Agent, or Firm*—Sheridan Ross. P.C

(57) ABSTRACT

A metal-infiltrated ceramic for use in tribological applications, such as in mechanical face seals, beatings and other sliding or rubbing components, which provides excellent durability and wear characteristics. The metal-infiltrated ceramic is useful in both the "harder" and "softer" one of two relatively sliding members which is in, or may come into, contact with each other during the motion of one of the members relative to the other. The material is a porous ceramic which has been infiltrated with a metal.

25 Claims, 3 Drawing Sheets

U.S. PATENT DOCUMENTS

| | | | |
|---|---|---|---|
| 3,895,811 A | 7/1975 | Richard, Jr. et al. | 277/22 |
| 3,928,662 A | 12/1975 | Kaneko et al. | 427/294 |
| 3,949,804 A | 4/1976 | Kaneko et al. | 164/62 |
| 4,069,157 A | 1/1978 | Hoover et al. | 210/433 |
| 4,108,672 A | 8/1978 | Klug et al. | 106/38.9 |
| 4,164,424 A | 8/1979 | Klug et al. | 106/38.9 |
| 4,232,091 A | 11/1980 | Grimshaw et al. | 428/472 |
| 4,363,644 A | 12/1982 | Sato et al. | 55/523 |
| 4,417,908 A | 11/1983 | Pitcher, Jr. | 210/510.1 |
| 4,824,622 A | 4/1989 | Kennedy et al. | 264/59 |
| 4,828,008 A | 5/1989 | White et al. | 164/66.1 |
| 4,849,266 A | 7/1989 | Dwivedi et al. | 428/34.4 |
| 4,853,352 A | 8/1989 | Newkirk et al. | 501/88 |
| 4,868,143 A | 9/1989 | Newkirk et al. | 501/127 |
| 4,894,160 A | 1/1990 | Abe et al. | 210/500 |
| 4,935,055 A | 6/1990 | Aghajanian et al. | 164/66.1 |
| 4,942,076 A | 7/1990 | Panicker et al. | 428/137 |
| 4,971,696 A | 11/1990 | Abe et al. | 210/500 |
| 4,981,590 A | 1/1991 | Van T Veen et al. | 210/490 |
| 4,983,423 A | 1/1991 | Goldsmith | 427/230 |
| 4,988,645 A | 1/1991 | Holt et al. | 501/91 |
| 5,000,246 A | 3/1991 | Dwivedi et al. | 164/97 |
| 5,000,247 A | 3/1991 | Burke | 164/97 |
| 5,000,249 A * | 3/1991 | Burke | |
| 5,004,034 A | 4/1991 | Park et al. | 164/97 |
| 5,004,035 A | 4/1991 | Burke et al. | 164/97 |
| 5,005,631 A | 4/1991 | Dwivedi | 164/97 |
| 5,007,475 A | 4/1991 | Kennedy et al. | 164/97 |
| 5,011,725 A | 4/1991 | Foster | 428/137 |
| 5,016,703 A | 5/1991 | Aghajanian et al. | 164/97 |
| 5,017,533 A | 5/1991 | Newkirk et al. | 501/127 |
| 5,020,584 A | 6/1991 | Aghajanian et al. | 164/97 |
| 5,040,588 A | 8/1991 | Newkirk et al. | 164/97 |
| 5,073,527 A * | 12/1991 | Newkirk et al. | |
| 5,089,881 A | 2/1992 | Newkirk et al. | 167/97 |
| 5,118,647 A * | 6/1992 | Newkirk et al. | |
| 5,161,728 A | 11/1992 | Li | 228/124 |
| 5,163,498 A * | 11/1992 | Kanter et al. | |
| 5,163,499 A | 11/1992 | Newkirk et al. | 167/98 |
| 5,165,463 A * | 11/1992 | Aghajanian et al. | |
| 5,188,164 A | 2/1993 | Kantner et al. | 164/97 |
| 5,203,488 A | 4/1993 | Wang et al. | 228/122 |
| 5,223,138 A | 6/1993 | Zievers et al. | 55/523 |
| 5,224,533 A * | 7/1993 | Kanter et al. | |
| 5,238,045 A | 8/1993 | Park et al. | 164/97 |
| 5,248,079 A | 9/1993 | Li | 228/121 |
| 5,249,621 A | 10/1993 | Aghajanian et al. | 164/97 |
| 5,267,601 A | 12/1993 | Dwivedi | 164/97 |
| 5,340,947 A | 8/1994 | Credie et al. | 174/262 |
| 5,395,701 A | 3/1995 | White et al. | 428/614 |
| 5,401,406 A | 3/1995 | Johnson et al. | 210/450 |
| 5,415,772 A | 5/1995 | Garcera et al. | 55/DIG. 30 |
| 5,422,322 A | 6/1995 | Chen et al. | 501/90 |
| 5,490,679 A | 2/1996 | Borrino et al. | 277/65 |
| 5,534,308 A | 7/1996 | Bamberg et al. | 427/454 |
| 5,538,649 A | 7/1996 | Demendi et al. | 508/101 |
| 5,580,834 A | 12/1996 | Pfaff | 501/90 |
| 5,614,043 A | 3/1997 | Ritland et al. | 156/89 |
| 5,676,907 A | 10/1997 | Ritland et al. | 264/643 |
| 5,700,373 A | 12/1997 | Ritland et al. | 220/558 |
| 5,707,567 A | 1/1998 | Pfaff | 264/29.7 |
| 5,735,332 A | 4/1998 | Ritland et al. | 164/98 |

OTHER PUBLICATIONS

Maxwell, et al., 1990, *Metallurical Transactions B*, 21B:475–485 (No month).

Naidich, 1981, *Prog. in Surf & Membrane Sc.*, pp. 353–485 (No month).

Nifterik, Superstake Metaalmatrixcomposiet Wordt Betaalbaar Met Nieuw Procede, 10426 Polytechnish Weekblad (1991), Rijswijk, Netherlands (with translation) (No month).

O'Brien et al., 1974, *J. of the Amer. Ceramic Society*, 57:329–332 (No month).

Seitz, et al., 1989, *Interface in Metal–Ceramics Composites, The Minerals, Metals and Materials Society*, pp. 197–212 (No month).

Zhong, et al., 1993, *J. of the Amer. Ceramics Society, Equilibrium Phase Diagrams in the Systems PbO–Ag and 'CuO–Ag*, pp. 2663–2664 No month.

* cited by examiner

.3005 in.

112

102

1.0314 in.

104

1.5037 in.

METAL-INFILTRATED CERAMIC SEAL

CROSS-REFERENCE TO RELATED APPLICATIONS

This patent application is a continuation-in-part of U.S. patent application Ser. No. 08/949,227, filed Oct. 13, 1997, issued as U.S. Pat. No. 6,143,421 on Nov. 7, 2000, which is a continuation-in-part of all three of U.S. patent application Ser. No. 08/220,558, filed Mar. 31, 1994, issued as U.S. Pat. No. 5,700,373 on Dec. 23, 1997, U.S. patent application Ser. No. 08/220,560, filed Mar. 31, 1994, issued as U.S. Pat. No. 5,676,907 on Oct. 14, 1997, and U.S. patent application Ser. No. 08/820,164, filed Mar. 19, 1997, which is a divisional of U.S. patent application Ser. No. 08/220,570, filed Mar. 31, 1994, issued as U.S. Pat. No. 5,614,043 on Mar. 25, 1997. U.S. patent application Ser. Nos. 08/220,558, 08/220,560 and 08/220,570, all filed Mar. 31, 1994, are continuations-in-part of PCT/US93/08835, filed Sep. 17,1993, which is a continuation-in part of U.S. patent application Ser. No. 07/946,972, filed Sep. 17, 1992, now abandoned. All of the patents and patent applications mentioned in this paragraph are incorporated by reference herein in their entirety. See also U.S. patent application Ser. No. 08/220,569, filed Mar. 31, 1994, issued as U.S. Pat. No. 5,626,914 on May 6,1997; U.S. patent application Ser. No. 08/220,559, filed Mar. 31, 1994, issued as U.S. Pat. No. 5,525,374 on Jun. 11, 1996 and U.S. patent application Ser. No. 08/220,557, filed Mar. 31, 1994, issued as U.S. Pat. No. 5,503,122 on Apr. 2, 1996; all of which are incorporated by reference herein in their entirety.

FIELD OF THE INVENTION

The present invention relates to a metal-infiltrated ceramic for use in tribological applications, and more specifically relates to the use of such a metal-infiltrated ceramic in mechanical face seals, rotary unions, sliding gate seals, bushings, bearings and other sliding or rubbing components which require good durability and wear characteristics, good corrosion resistance and good thermal conductance.

BACKGROUND OF THE INVENTION

Material science has long been used as a basis for choosing materials for components having surfaces which are in, or may come into, sliding, rolling or mixed-mode contact with each other. For example, in the field of mechanical face seals, a primary ring made of carbon or carbon-like material and a mating ring made of harder material, such as ceramic or metal, are generally known.

The search for appropriate materials for making seals is an ongoing endeavor. In the past, seals have been made from metals, ceramics, ceramic-coated metals, metal-coated ceramics and sintered metals. There is still a need to improve performance characteristics of seals. In particular, it is desirable that the material from which a seal is made be wear resistant, chemical resistant, and resistant to thermal shock.

Seals are typically subjected to high amounts of wear and abrasion. For example, mechanical face seals are subjected to sliding forces across the sealing face during their useful life. Other types of seals are subjected to abrasion and wear on other surfaces. Therefore, it is a critical aspect of the seal material that it be resistant to abrasion and wear. While many materials have proven effective for use in seals, it is still desirable to find a seal material which provides even further improvement in this regard.

In certain uses, seals can be subjected to thermal shock. For example, a seal in a water pump may initially be heated to a high temperature due to frictional forces as the pump shaft begins to rotate. However, once the seal comes into contact with a fluid, such as cool water, the temperature rapidly decreases. Many materials are unable to withstand such a thermal shock, and fail. Therefore, it is desirable to find a material that can withstand thermal shock. For example, silicon carbide is used as a ceramic seal because it has the advantage of having a relatively high thermal conductivity when compared to an alumina seal. However, silicon carbide also has the disadvantages of being brittle and expensive.

In some environments, a seal may be exposed to caustic or corrosive chemical attack. Many prior art materials are unable to withstand sustained exposure to highly reactive chemicals. Therefore, it is desirable that the seal material be relatively non-reactive and able to withstand chemical attack.

Therefore, it would be advantageous to provide a material for making seals which has one or more of the following desirable properties: wear resistance, thermal conductivity and chemical resistance.

SUMMARY OF THE INVENTION

In accordance with one embodiment of the present invention a sliding or bearing member comprising a metal-infiltrated ceramic which combines a number of excellent properties in respect to chemical resistance, thermal conductivity, extremely low permeability, high mechanical strength and high modulus of elasticity, and a material that exhibits excellent dimensional stability, wear performance, low friction at the seat interface, running characteristics and tribological compatibility with a mating member is provided. As used herein, the term "seal" will be used generically to refer to all devices useful in sliding or rubbing applications, including mechanical face seals, rotary unions, sliding gate seals, bushings, bearings, etc. For example, the seal of the present invention can be used in sliding face applications, such as pump seals, and in environments where such seals are exposed to acidic, caustic, corrosive or abrasive substances and in environments where such seals are exposed to thermal shocks.

In accordance with an embodiment of the present invention, a seal is provided which is made of a ceramic-metal composite. The ceramic has a three 3-dimensional interconnected pore structure which is infiltrated with a metal. Preferably, the metal is capable of infiltrating the ceramic at a rate of at least 0.1 centimeters per minute. Preferably, in addition to the metal phase there is a separate phase that forms an immiscible liquid at process temperatures that adjust surface energy to allow the metal to infiltrate the ceramic by capillary action, with no requirement for overpressure to provide a driving force for the infiltration of the metal into the ceramic. Preferably the additional phase is a metal oxide, such as copper oxide, lead oxide and nickel/manganese/aluminum oxide.

Examples of metals suitable for infiltration include copper, nickel, aluminum, iron, stainless steel, titanium, magnesium, brass, bronze, nickel-chromium alloy, nickel aluminide and alloys thereof. Preferably the ceramic is selected from the group including alumina ($Al_2O_3$), titania ($TiO_2$), zinc oxide (ZnO), zirconia ($ZrO_2$), iron oxide ($Fe_2O_3$), magnesia (MgO), silica ($SiO_2$), silicon carbide (SiC), silicon nitride ($Si_3N_4$), aluminum nitride (AlN) or titanium diboride ($TiB_2$).

The composite material of the present invention can exhibit wear resistance equal to or superior to conventional seal materials. The composite material of the present invention can run against itself or other hard or soft materials in a large number of sliding face applications. The composite material of the present invention can exhibit thermal shock resistance superior to conventional materials. In catastrophic failure or dry run conditions, such as fluid loss in pump applications, seals made of the material of the present invention can have high survivability and can maintain their integrity, while seals made of other materials can fail.

DETAILED DESCRIPTION

Figure 1:
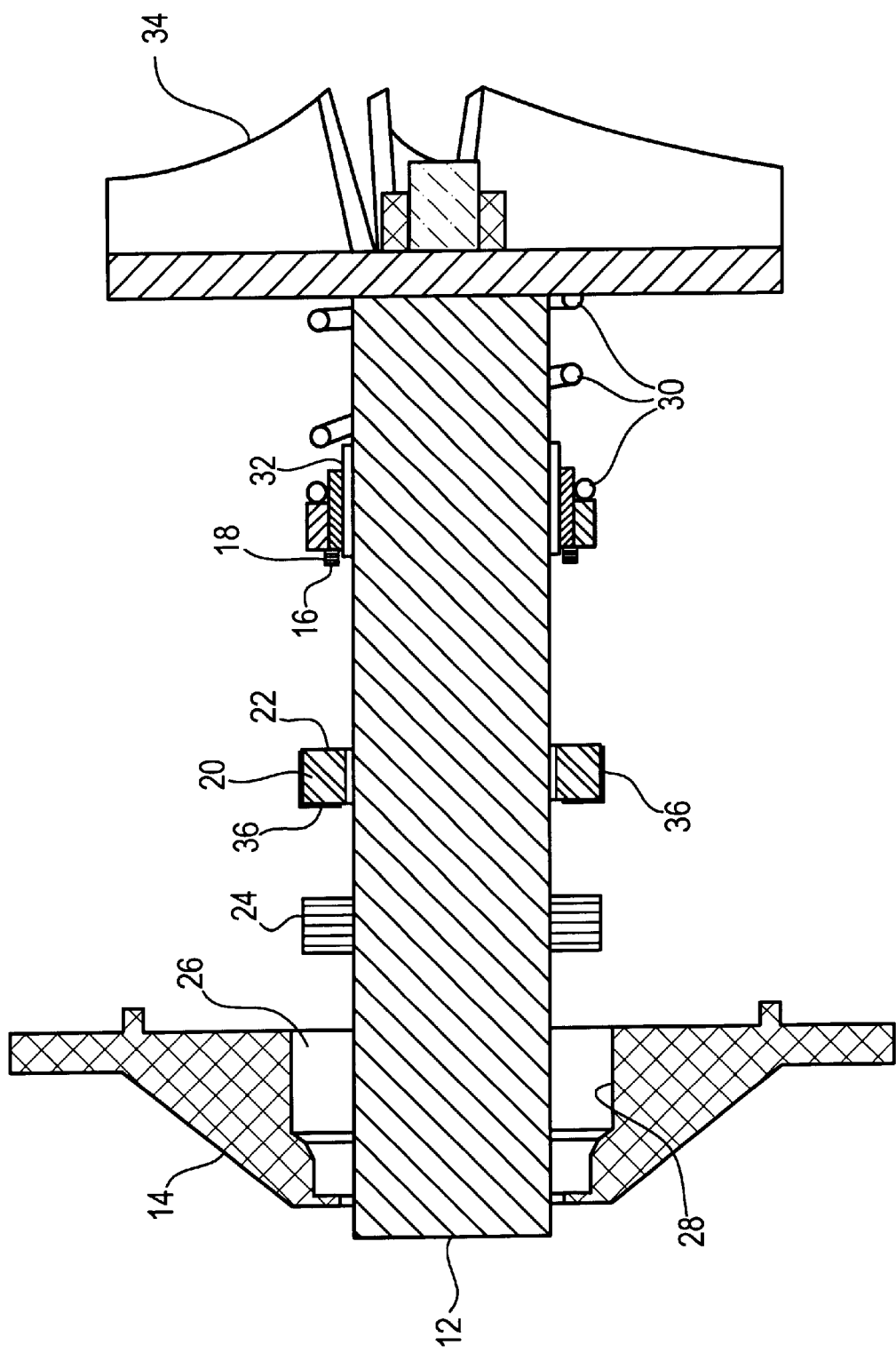
FIG. 1 illustrates a typical mechanical face seal assembly.

FIG. 1 illustrates an exploded view of a typical mechanical face seal assembly in accordance with the present invention. Mechanical face seals such as illustrated in FIG. 1 are generally used to prevent a fluid from leaking between a rotatable shaft 12 and a stationary housing 14 through intimate contact between the face 16 of a rotating seal 18 and the face 22 of a stationary seal 20. A secondary stationary seal 24 can be employed to help prevent leakage of a pumpant material, such as a fluid or pumpable solid.

In use, the optional secondary stationary seal 24 and the stationary seal 20 can be press fit into the seal recess 26. The outer diameters of the stationary seal 20 and the secondary stationary seal 24 are press fit against the wall 28 of the seal recess 26, in order to prevent fluid from escaping around the outer diameter. The inner diameter of the stationary seal 20 and secondary stationary seal 24 is sized such that the shaft 12 can rotate within the inner diameters.

On the other hand, the rotating seal 18 is mounted to the shaft 12 in such a way that the rotating seal 18 will rotate together with the shaft 12. During use the spring 30 will urge the sealing face 16 of the rotating seal 18 against the sealing face 22 of the stationary seal 20. The sealing faces 16 and 22 meet in close sliding contact and the spring 30 provides the force necessary to maintain intimate contact between the sealing faces 16 and 22.

A secondary rotating seal 32 can be employed to prevent leakage between the rotating seal 18 and the shaft 12. The shaft can be attached to a motor (not shown) at one end and another device at the other end. In the embodiment shown in FIG. 1, the shaft is attached to an impeller 34 which is employed to pump fluid. The mechanical face seal assembly illustrated in FIG. 1 thus prevents the fluid from escaping from inside the housing to an area outside the housing through the area adjacent the rotatable shaft 12.

In a preferred embodiment, the stationary seal 20 is made of a metal-infiltrated ceramic material. In this embodiment, the rotating seal 18 can be a hard or soft material, but is preferably a soft material such as graphite. Alternatively, the stationary seal 20 can be made of a soft material, such as graphite, and the rotating seal 18 can be metal-infiltrated ceramic. In another embodiment, both the stationary seal 20 and the rotating seal 18 can be made of a hard material, such as metal-infiltrated ceramic. Preferably, the secondary stationary seal 24 and secondary rotating seal 32 are made of a flexible material, e.g. chemically resistant high temperature synthetic rubber such as VITO™.

Figure 2:
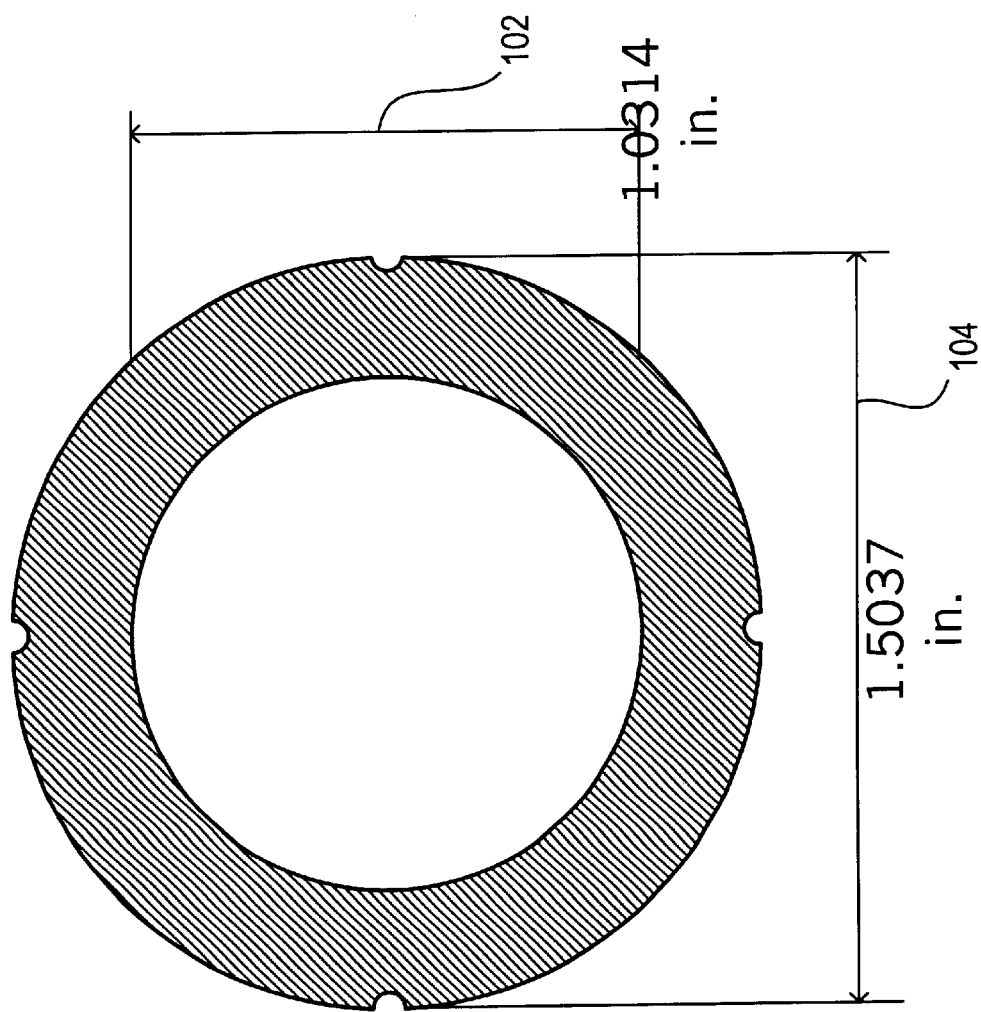
FIG. 2 illustrates a front view of a typical seal of the present invention.

A typical rotating seal 18 is illustrated in FIG. 2. The sizes of the rotating seal can vary depending on the specific application. A typical seal employed in a water pump can have an inner diameter 102 of approximately 1 inch, an outer diameter 104 of approximately 1.5 inches and a thickness 112 (see FIG. 3) of approximately ⅓ of an inch. However, many other dimensions would also be appropriate, and the seal of the present invention is not limited to any particular size.

As will be appreciated, other sealing devices, such as O-rings, can be provided to maintain the desired sealing relationship between the various seals and the components to which they are mounted.

The materials described herein can be used with any appropriate devices, and in particular devices which come in sliding contact, such as rotary unions, mechanical face seals, bearings, bushings, rotary seals, sliding gate seals and other sliding, rubbing or rolling components.

The material characteristics and operating conditions of a seal determine its ability to perform its required function. If the material is not suited for the intended application and operating conditions, premature failure is probable.

There are several factors that can lead to failure of a mechanical seal. In many cases the premature failure of seals is caused by human error. Improper handling of seal materials during installation and improper maintenance of associated equipment are examples of a common cause of premature seal failure. Poor design and selection of materials can also easily lead to inadequate life of a seal system. In order for a seal to be resistant to human errors it must be robust and not easily damaged. A material with an ability to take moderate abuse without chipping, cracking or scratching is preferred. The choice of material cannot eliminate human error, but it can reduce the impact that human error has on the seal life.

It is believed that the composite material of the present invention is effective in reducing problems caused by human error. A common human error is found when a seal is improperly forced into a recess. Because a typical function of the seal is to prevent the infiltration of the fluid, seals are often designed to fit tightly within a recess. Therefore, brittle materials, such as ceramics, can fail when they are forced into a tight-fitting recess. On the other hand, the metal-infiltrated ceramic of the present invention typically has a high degree of toughness and damage tolerance. Therefore, it is easier to place into a tight-fitting recess without failure than a pure ceramic. Preferably, the seal has a toughness of greater than 10 MPam½. Because of the toughness, the stationary seal of the present invention can be directly pressed into a housing. As a result, the optional secondary stationary seal can be eliminated, saving time and money. Furthermore, the robustness of the stationary seal may be improved by banding the outer radius. The band 36 about the stationary seal 20 is illustrated in FIG. 1.

However, even if none of the problems associated with human error are present, a seal will eventually fail. The tribology at the intersection between two seal faces will help determine the rate at which the seal system will "wear out" and fail. Surface wear is simply the loss of material from the surface of a solid body. This loss of material eventually leads to the inability of the seal to retain fluid.

It is believed that there are four main types of surface wear. A surface may experience wear due to adhesion, abrasion, corrosion or surface fatigue. In the case of constant applied load and pure sliding, as in a mechanical seal, surface fatigue is typically not an important factor. The seal is thus subject to one or a combination of the other three wear processes. Surface fatigue is an important factor in bearings. The ceramic metal composite of the present invention has good surface fatigue characteristics. Tests have shown that the ceramic metal composite of the present invention advantageously performs more like a metal than a ceramic with respect to surface fatigue. Therefore, it can be used in bearing components such as ball or needle bearings or in the race.

If a seal is operated under conditions it was designed for it will eventually fail due to wear. A material that can effectively combat the three types of wear seen by a mechanical seal is very versatile. The characteristics of the seal material may directly or indirectly control the amount of wear that occurs. In any case, the material controls the wear by affecting the interaction between the surfaces.

Adhesive wear occurs between two solid bodies when they are in sliding contact with one another. Adhesive wear can result in the pulling of fragments out of one contact surface and transferring them to the other, leading to abrasive wear. This occurs due to the strong adhesive forces that are created when atoms come in very close contact. The surface of a material can be visualized as an arrangement of peaks (asperities) and valleys. When the asperities of two bodies come in contact during sliding, asperities may break off. If this occurs, a transfer particle is created and the body has lost a small amount of material. Adhesive wear is typically characterized by the presence of particles from the softer material on the surface of the harder.

Relative rubbing contact between the seal faces 16 and 22 is detrimental to the purpose of maintaining parallel surfaces and of providing good sealing engagement between the seal faces. Over periods of long use, for example, in a pump or blower, the seal faces rub against each other for extended periods of time. Foreign material from either the fluid being sealed in the chamber or from the external environment or from the seal materials themselves may become lodged between the seal faces 16 and 22 causing undesirable abrasion on one or both of the seal faces 16 and 22. Abrasion as a result of foreign bodies is typically referred to as "third body wear".

Abrasion is the process of particles or other materials on the surface of one material gouging and removing material from the other, softer surface. The removed material potentially becomes loose wear particles. The hard abrasive particles may exist due to a rough surface (tall asperities) or hard contaminating particles embedded in the harder material or contaminants from the fluid or environment. The surface of the material being abraded will exhibit a series of grooves that have been plowed into it by the harder particles on the opposing surface. Determining the roughness of a surface and the presence of hard contaminating particles is important when examining a surface for abrasive characteristics.

The surface topography of the materials contributes to the type of lubrication that will be present in a seal. A profilometer is one type of measuring device that can record the profile of a surface and calculate several statistical measures. Common statistical values are the arithmetic mean roughness (Ra) and root mean square roughness (Rq). Many times a surface profile is described with only one of these parameters. In situations where lubrication and wear are important the Ra or Rq values are not adequate descriptors. A surface may have predominantly positive (high peaks) or negative (deep valleys) features which create very different lubrication situations but have the same Ra and Rq values. To denote the predominance of peaks or valleys on a surface, an amplitude distribution curve such as the skewness (Sk) can also be measured. A predominantly negative surface is desirable for lubrication and wear applications for several reasons. There is a reduced chance of asperity contact resulting in the reduction of adhesive contact and/or the creation of abrasive particles. It is also easier to develop full-film lubrication because it does not need to be as thick to separate the two materials and avoid asperity contact and the valleys create pockets for the liquid lubricant to reside. It is important to recognize that a surface may initially have a desirable negative surface but as wear takes place the surface profile may change.

The harder of the two materials may also abrade the softer one, creating a "transfer" layer on one or both faces. This transfer layer changes the conditions of surface interaction drastically. Sometimes it is the transfer layer itself that causes the failure of a seal. In a common alumina ($Al_2O_3$) and carbon-graphite seal system, the softer carbon often builds a thick transfer layer in three or four locations on the surface of the alumina. Eventually the seal fails because the transfer layer at these locations becomes so thick that it separates the faces, creating a leak path for the lubricant.

The hardness of the seal material becomes important when abrasive wear is present. The harder a substance the greater its resistance to abrasive wear. The hardness of ceramics provide one of the major advantages of using them as seals. Preferably the seal has a Rockwell C hardness of at least 35, more preferably at least 45 and more preferably at least 60. As previously mentioned the harder surface has a tendency to create transfer particles and therefore create a transfer layer. This transfer layer can be desirable to obtain a useful life cycle from the seal. The transfer layer can be beneficial by reducing friction and wear by creating solid state lubrication. Selection of the seal materials and their surface topography determine the development of the transfer layer.

Figure 4:
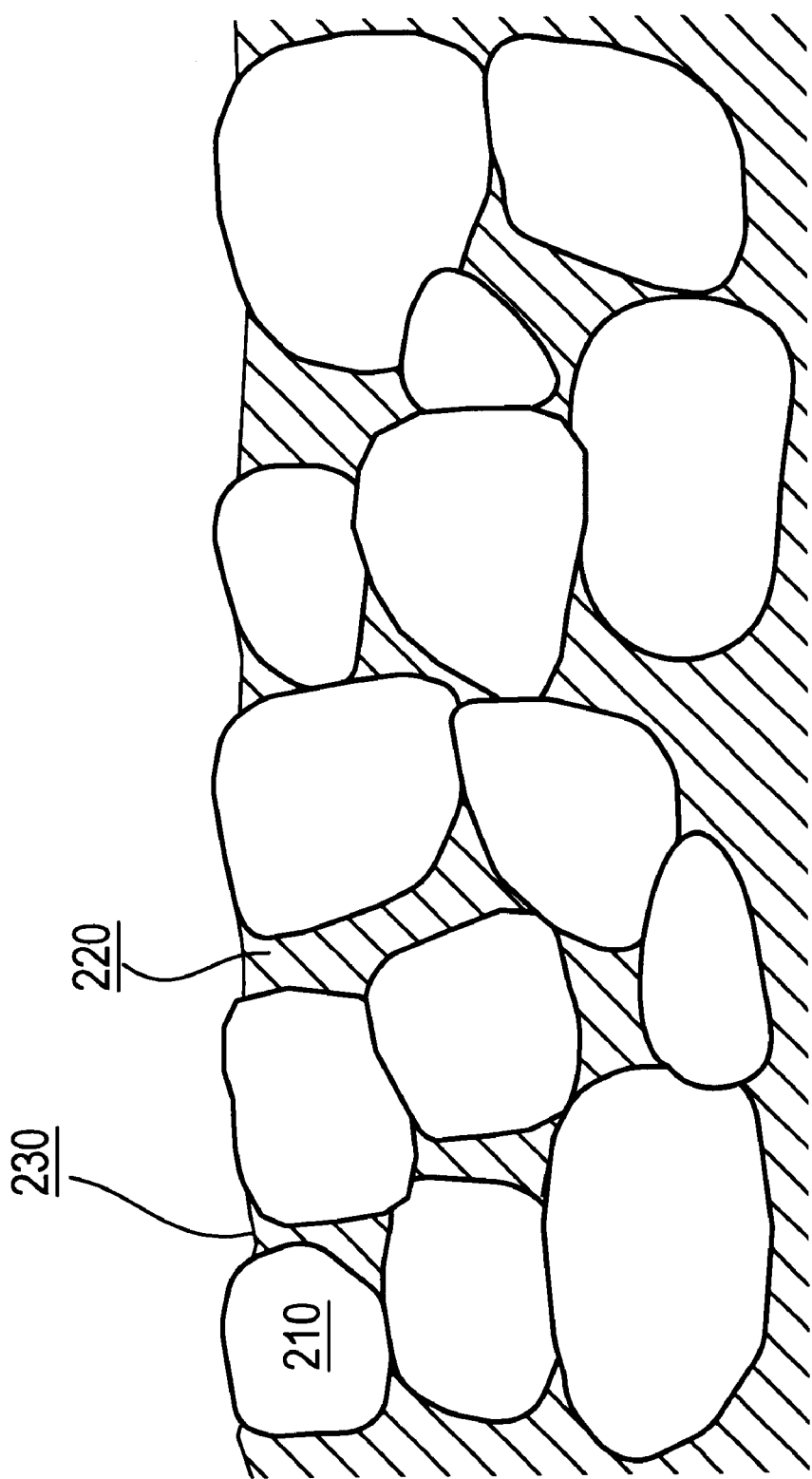
FIG. 4 illustrates a cutaway, sectional view of the surface of the composite material of the present invention.

While not wishing to be bound by any theory, it is believed that the surface characteristics of the metal-infiltrated ceramic of the present invention provides important advantages in avoiding abrasion. As shown in FIG. 4, the surface of the metal-infiltrated ceramic of the present invention includes ceramic portions 210 and metal portions 220. The metal portions 220 will typically be removed by physical and chemical forces more readily than the ceramic portions 210. This process is referred to as "preferential erosion" or "preferential corrosion". Therefore, the metal portions 220 will form recesses 230. It is believed that these recesses 230 provide useful "reservoirs" for loose wear particles to become deposited or embedded. The softer phase in the composite will allow the hard particles to be embedded therein and thus be removed from the interface. Loose wear particles which are deposited or embedded in the recesses 230 are much less likely to contribute to abrasive wear of the sealing surfaces. The recesses 230 are also useful reservoirs for fluid entrapment, and the fluid can act as a liquid lubricant. By providing these useful recesses 230, both grooving and the formation of transfer layers can be reduced.

Corrosive wear occurs when the sliding contact takes place in an environment that is corrosive to one or both of the materials in contact. The sliding motion removes material and any protective layer that may form on the surface to slow the corrosion process. Corrosive wear is difficult to recognize by surface examination. A difference in wear rates may be observed by varying the environment in which the sliding takes place. This is a good indication that corrosion is a factor in the wear process.

A desirable property of seal materials is resistance to corrosive attack and subsequent accelerated wear. The more resistant a material is to a variety of corrosion types the more versatile that material becomes.

The ceramic portion of the seals of the present invention are typically much more resistant to corrosive wear than is the metal portion. Therefore, the seals will be more resistant to corrosive attack than an all metal seal. While the metal portions may corrode faster than a pure ceramic seal, it is believed that the recesses 230 caused by the metal corrosion provide a number of advantages. Additionally, as the recesses 230 deepen, it is believed that the rate of corrosive wear will slow because the recesses 230 are not subjected to both corrosive and mechanical wear and also because the corrosive materials can not reach the metal portions 220 as easily.

There are several material properties as well as service conditions that determine the type of wear that occurs. The service life of a seal is controlled largely by the state of lubrication at the place of contact. If a full-film layer of lubrication exists, then the surfaces do not make contact creating a situation where adhesive wear cannot occur and abrasive wear can be avoided. This is usually an ideal situation for minimizing the wear in seals. In reality, it is difficult to create full-film lubrication in seals and some direct contact between the surfaces occurs. When the surfaces come into intimate contact all three types of wear can be present.

While not wishing to be bound by any theory, it is believed that the present composite material is advantageous in providing a layer of surface lubrication. It is believed that the "reservoirs" formed by the recesses 230 in the metal portions 220 on the surface of the seal material provide storage areas for fluid lubricants. As illustrated in FIG. 4, the metal portions 220 on the surface form recesses 230. The fluid lubricants can remain in these recesses 230 even when the seal is not in use or when the fluid is not being provided to the seal surface. Thus, the fluid in these reservoirs can help form a film layer during use, while prior art seal materials having a smoother surface would be subjected to a dryer, less lubricated interface.

A third major cause of seal failures is due to deleterious thermal conditions of the seal materials and physical arrangement. The thermal properties of the seal material will determine its susceptibility to thermal stress fracture, a limitation in the use of many common seal materials. A rapid change in temperature of the seal can cause thermal shock and lead to cracking and third bodies. The ability of the seal to conduct heat from the sliding interface is also important. If the seal is exposed to a corrosive environment, a higher temperature also usually means higher corrosive reaction rates. If the temperature at the interface is too high, the fluid film begins to boil and vaporization will drastically reduce the life of the seal through corrosive wear. Even tap water can become very corrosive to many materials when in a state of hot vapor.

The properties and surface topography of the materials become important in various ways depending on the lubrication situation. Several of the material properties, such as thermal conductivity and surface structure determine the amount of lubrication available. The thermal properties of the material will contribute to the temperature rise at the interface because the seal components must dissipate most of the friction heat generated at the interface. If the process fluid is the lubricating medium then it is preferable for the temperature at the interface to be controlled enough to evaporate the fluid just as it "leaks" past the seal. If the temperature rise goes beyond this the risk of increased corrosive wear and vaporization at the interface increases. A balance between the thermal stress resistance and thermal shock resistance is desirable for optimal performance. A seal material that can withstand a wide range of temperature profiles and cycling becomes useful to a broader range of applications.

The metal-infiltrated ceramic of the present invention provides excellent thermal conductance. This is because the continuous metal portion of the composite can rapidly conduct heat away from the surface, even though the ceramic portion is a thermal insulator. This provides important advantages over a pure ceramic seal, which is much more susceptible to thermal shock. Preferably, the composite material of the present invention has a thermal conductivity at 20° C. of at least 50 W/m° K, more preferably at least 75 W/m° K and more preferably at least 150 W/m° K. The composite material of the present invention preferably has a thermal shock resistance of at least Δ200° C., more preferably at least Δ300° C. and more preferably at least Δ500° C. The thermal shock resistance is determined by quenching samples of the composite material in water from various elevated temperatures. The change in temperature where a sharp decrease in flexural strength is observed is listed as the thermal shock resistance (ΔTc).

A preferred metal-infiltrated ceramic in accordance with the present invention is a composite continuous matrix of both alumina ($Al_2O_3$) ceramic and copper metal. This gives the material several unique properties. Metal-infiltrated ceramic contains the ceramic which is relatively hard and inert for corrosion and abrasion resistance as well as the metal for excellent heat transport capabilities and for thermal shock resistance and enhanced mechanical properties.

In accordance with the present invention, a method is provided for making a ceramic-metal composite material with interconnecting and substantially continuous ceramic and metal phases. The composite is formed by infiltrating molten metal into a porous ceramic body having a substantially interconnected continuous pore structure or "open porosity".

The ceramic matrix material can be chosen from any of a number of metal oxides, carbides, nitrides or the like. For instance, the ceramic matrix can comprise alumina ($Al_2O_3$), titania ($TiO_2$), zinc oxide (ZnO), zirconia ($ZrO_2$), iron oxide ($Fe_2O_3$), magnesia (MgO), silica ($SiO_2$), or any other metal oxide. Further, non-oxide ceramics such as silicon carbide (SiC), silicon nitride ($Si_3N_4$), aluminum nitride (AlN), aluminum titanate ($Al_2TiO_5$) or titanium diboride ($TiB_2$) can be used as the ceramic matrix material. Preferred matrix materials include alumina, aluminum titanate, silicon carbide, zirconia and silicon nitride.

The infiltrant metal can be selected from any metal whose melting point is below the melting point of the ceramic matrix material. For example, copper (Cu), nickel (Ni), aluminum (Al), iron (Fe), titanium (Ti), magnesium (Mg) or alloys thereof can be used for the metallic penetrating phase. Preferred metals include copper, iron, stainless steel, nickel, titanium, aluminum, magnesium, brass (Cu—Zn), bronze (Cu—Sn), nickel-chromium alloy (Ni—Cr), and nickel aluminide (NiAl). Further, high strength super alloys and other high-grade metals can advantageously be selected depending on the intended application of the ceramic-metal composite material.

The ceramic matrix material is a sintered, coherent body and should have an open and substantially continuous pore structure to facilitate the infiltration of molten metal into the matrix without the use of substantial overpressure. As used herein, the term "substantial overpressure" refers to pressure in excess of about three atmospheres (about 45 psi) applied during the infiltration process, either mechanically or through the use of pressurized gas. Porous ceramics can be formed in a number of ways known to those skilled in the art of ceramic processing. Preferably, the composite is made from a ceramic preform having a shape that is substantially similar to the desired metal-infiltrated ceramic seal.

The porous ceramic body has a substantially continuous and interconnected pore structure. The total porosity and average pore size of the sintered ceramic matrix can be controlled by controlling the porosity of the green body and the sintering conditions. As such, the porous ceramics form suitable matrices for infiltration with molten metals to produce ceramic-metal composites having interpenetrating three-dimensional structures.

A green body is preferably formed comprising ceramic powder. In one embodiment of the process, the powder has an average particle size of from about 0.1 microns to about 5 microns. It is not believed that the starting particle size is particularly critical to the practice of the present invention, however, a smaller average particle size can be used to produce a sintered body having a lower average pore size.

The average particle size of the powder can advantageously be reduced to a desired size by comminution processes such as by using a ball mill or an attrition mill. A ball mill is a hollow rotating cylinder or conical cylinder partially filled with hard, wear-resistant media that impacts the powder to reduce the particle size of the powder. An attrition mill is a stirred-media mill wherein a central shaft with arms rotates to mix the particles with hard spherical media. The degree of reduction in particle size can be controlled by controlling the amount of time in the mill. Liquids can also be added to the mill charge to assist in the comminution process and control agglomeration of the particles.

According to one embodiment of the present invention, it may be desirable to form agglomerates of the powder as a means of controlling the porosity of a green body formed from the powder. For example, aluminum hydroxide (Al(OH)$_3$) particles having a diameter of, for example, about 50 micrometers can be calcined to form alumina agglomerates that have a porosity of about 50 percent. As used herein, all percentages refer to volume percent, unless otherwise noted.

After a ceramic powder having a desired particle size range has been obtained, the powder can be formed into a green body. As used herein, the term green body refers to an unsintered cohesive body comprising ceramic powder. For example, the powder can be uniaxially pressed at a pressure of from about 20 MPa to about 130 MPa (3 ksi to 20 ksi) or isostatically pressed at similar pressures. In addition, forming additives can be used to improve the mechanical strength of the green body formed by pressing the ceramic powder. Additives can include binders such as polyvinyl alcohol, plasticizers such as polyethylene glycol, and lubricants such as aluminum stearate. In addition, other forming methods such as injection molding, extrusion, slip casting and the like can be used to form green bodies according to the present invention. Such methods are particularly advantageous when the sintered ceramic matrix will be a preform of complex shape that is to be infiltrated with a molten metal. Techniques such as injection molding are useful for fabricating articles having intricate and complex structures and a near-net shape.

Further, some green bodies with high levels of forming additives may have sufficient strength to enable the green body to be machined. Thus, intricate parts may advantageously be formed by maching processes while the piece is in the soft green state.

According to the present invention, one method for controlling the total porosity of the sintered ceramic matrix is to control the total porosity of the green body. This can be done, for example, by varying the pressing pressure. Typically, green bodies formed by uniaxially pressing finely-divided ceramic powder have porosities ranging from about 35 percent to about 50 percent. The total porosity can be increased by using agglomerated powder, as discussed hereinabove. In one embodiment, the agglomerates having a porosity of about 50 percent can be pressed into an arrangement yielding a void space between agglomerates of 50 percent. Thus, the compact may have a total porosity of about 75 percent.

After forming the green body, the green body can be sintered to obtain a sintered ceramic body. If organic binders or other organic materials are used in the green body forming process, these additives can advantageously be removed prior to fully sintering the ceramic powder. This is commonly referred to as "binder burnout." For example, the green body can be placed in a furnace and slowly heated to a temperature of, for example, about 600° C. to volatilize or combust organic additives. Since these organic additives comprise a large amount of carbon, it is preferable to combust these materials under a flowing gas such as oxygen.

In one embodiment of the present invention, the green body is presintered. Presintering is a convenient and economical method of controlling the total porosity of the final sintered body. Presintering conveniently lowers the porosity of the green body to a range that is desirable for the sintered body, since certain sintering techniques do not substantially affect the total porosity of the sintered body.

Preferably, the presintering step is done at a temperature that is slightly below the normal solid-state sintering temperature of the ceramic material. For example, alumina can be presintered at a temperature of from about 1000° C. to about 1600° C., more preferably from about 1300° C. to about 1550° C. The sintering atmosphere is not critical and, therefore, air is preferred. However, certain atmospheres may be undesirable due to reactions between the atmosphere and the ceramic material at the sintering temperature. The presintering step preferably produces a presintered body having a total porosity of from about 10 percent to about 50 percent. The total porosity can be controlled by varying the time at the presintering temperature, such as from about 1 minute to about 300 minutes. The presintering step can determine the total porosity of the final sintered body.

The ceramic body may be sintered in a variety of systems. For example, a simple tube furnace may be employed.

In accordance with another embodiment of the present invention, a method is provided for infiltrating a metal, preferably copper, into a porous ceramic in a tunnel kiln. In one embodiment, the method involves infiltrating molten copper into a porous sintered ceramic body, which is previously sintered in a separate operation. In accordance with another embodiment, a green body is sintered and the sintered body is infiltrated all in the same tunnel kiln.

While not wishing to be bound by any theory, it is believed that the unexpected results achieved in connection with this embodiment of the present invention result from the incomplete oxidation of the molten infiltrant metal (e.g., copper) in the tunnel kiln. This is unexpected because copper has a relatively large affinity for oxygen. Therefore, one might expect that the molten copper would be completely oxidized in a tunnel kiln. However, it was unexpectedly discovered that an oxidized layer formed on the surface of the copper, thereby slowing oxidation of the molten copper beneath this oxidized layer. This oxidized layer is also believed to improve the infiltration of the molten copper into the porous ceramic.

Metals other than copper can also be employed. In order to be usefull, the metal should have certain characteristics. For example, the metal should have a low melting oxide which melts at a temperature less than the melting temperature of the ceramic but at a temperature greater than the melting temperature of the elemental metal. Additionally, the metal oxide should be capable of wetting the interior pores of the porous sintered ceramic in order to assist in the infiltration of the molten metal into the porous ceramic. Further, the metal oxide should have a high adhesion with the molten metal in order to assist in the infiltration of the molten elemental metal into the wetted porous ceramic by capillary action. It is also desirable that the metal oxide does not react in an undesirable way with materials used in the process. For example, it has been found that nickel oxide and aluminum oxide can flux through crucibles in their molten state, thereby damaging process equipment.

In order to prevent oxidation of the molten metal from proceeding too rapidly, the local atmosphere near the molten metal can be controlled. For example, the porous ceramic can be placed together with the metal to be melted in a device designed to control the diffusion of oxygen to the molten metal. For example, the ceramic and metal can be placed within refractory materials which impede the flow of oxygen during the process. An example would be a refractory material placed above and below the porous ceramic and the metal to be infiltrated therein and a seal of fireman's putty placed between the refractory shells which house the porous ceramic and metal to be infiltrated therein. Furthermore, excess oxygen can be removed from the local atmosphere by providing an amount of excess metal adjacent the parts to be produced. This excess metal can be placed, for example, in a crucible. The excess metal will remove part of the oxygen from the atmosphere thereby controlling the amount of oxygen which comes in contact with the metal which is to be infiltrated into the porous ceramic.

Preferably, the sintered ceramic has an identifiable shape and a free-standing form in the absence of constraining supports. This is to be distinguished from a vessel filled with loose or lightly packed particles or fibers of material. One of the advantages of using a cohesive sintered ceramic matrix is that the cohesive sintered ceramic matrix can be prefabricated into the shape of the desired seal (a preform). Further, the cohesive sintered ceramic matrix can be gripped by one portion (e.g., a top portion) while another portion (e.g., a bottom portion) is contacted with the molten metal. The molten metal can then be infiltrated by capillary action into substantially all of the open porosity of the ceramic, including those portions not emersed in the molten metal.

When a porous ceramic matrix having the desired total porosity, pore size and shape is obtained, molten metal can be infiltrated into the void space of the ceramic matrix. In a preferred embodiment of the present invention, the ceramic is brought into contact with the molten metal and infiltrates the ceramic by capillary action without the assistance of substantial pressure. The rate of infiltration is preferably at least 0.1 centimeters per minute, more preferably at least 1 centimeter per minute and more preferably at least 2 centimeters per minute. Thus, the molten metal enters the pore structure of the ceramic and fills substantially all of the void space.

According to a preferred embodiment of the present invention, a portion of the sintered ceramic body is contacted with the top surface of a molten pool of infiltrant metal for a time sufficient to infiltrate at least a portion of the sintered ceramic body. According to this embodiment, the infiltrant metal is placed in a refractory vessel and is heated to a temperature in excess of the melting temperature of the metal such that the metal is in the form of a molten pool having a top surface. Preferably, the metal is heated to a temperature that is sufficiently high to melt all constituents of the alloy and is high enough to yield a liquid metal with a low enough viscosity to permit infiltration in the absence of substantial pressure. For example, if oxygen is used as an infiltration additive, the temperature of the molten metal should be above the melting point of copper oxide, e.g., at least about 1230° C.

The sintered ceramic body is brought into contact with the molten metal and the molten metal infiltrates the open porosity of the ceramic and substantially fills the open porosity. The metal-infiltrated ceramic is then cooled to form the ceramic-metal composite having substantially continuous metal and ceramic phases. It is also possible to heat the composite in a reducing atmosphere to reduce any excess copper oxide to copper metal.

The pool of molten metal infiltrates the ceramic by capillary action which overcomes the forces of gravity and pulls the molten metal into the ceramic matrix. The advantage of using such a process is that the molten metal infiltrates the ceramic structure and no excess metal will flow out of the ceramic structure. Further, since capillary action is the driving mechanism for infiltrating the metal into the ceramic structure, the metal will infiltrate substantially all portions of the ceramic structure, regardless of the shape of the structure, without having to completely immerse the matrix into the molten metal. Further, the infiltrating metal can force out gas as the metal infiltrates so that little or no gas is trapped in the composite.

In order to fill substantially all of the void space in the ceramic matrix, it is necessary that the ceramic matrix material have a three dimensional, interconnecting pore structure. Capillary action will pull the metal into the ceramic and thereby fill substantially all of the void space. Although the ideal pore size will vary depending on the ceramic matrix material and metal being infiltrated, it is generally desirable that the average pore size be from about 1 micrometers to about 10 micrometers.

To improve capillary action between the ceramic and the molten metal, it may be desirable to modify the wetting or spreading characteristics of the ceramic and metal. One way to do this is to coat the ceramic with a coating that is more easily wetted by the molten metal. For instance, the surfaces of a magnesia or alumina ceramic can be modified by vapor phase coating the ceramic with nickel oxide. Similarly, the surface of an alumina ceramic can be modified by vapor phase coating the ceramic with copper oxide. The result of the above surface modifications is that the interfacial free energy of the ceramic is reduced and the metal can penetrate the pores more easily.

Another way of enhancing the wetting characteristics is to alter the chemical composition of the molten metal. This is typically accomplished by doping the molten metal with a dopant. For instance, molten metal can be doped with from about 2 weight percent to about 11 weight percent oxygen.

In one embodiment, molten copper can be doped with from about 2 weight percent to about 5 weight percent oxygen to form copper oxide ($Cu_2O$). Doping reduces the interfacial free energy between the metal and the ceramic.

After one or more of the surface modifications and chemical alterations noted above, if necessary, the molten metal will wet the ceramic and infiltrate substantially all of the void space of the ceramic through capillary action.

In a preferred embodiment, the metal infiltration step is performed in a vacuum atmosphere. As used herein, vacuum atmosphere refers to an atmospheric pressure of about 10 millitorr or less. The evacuation of air from the ceramic void space reduces the likelihood that air pockets will form in the metal infrastructure. It should be noted that the vacuum is applied at the time of infiltration only to remove air pockets, and not to drive the metal infiltration.

The temperature at which infiltration takes place is dependent on the ceramic and molten metal used. In one embodiment, an alumina ceramic with a 3 micrometer average pore size is infiltrated with copper doped with about 3 weight percent oxygen at about 1275° C. The total time required for infiltration is very short and can occur in less than about 1 minute in most cases.

The ceramic-metal composites produced by the present invention have relatively high strengths and toughness. In one embodiment, a composite comprising about 65 percent alumina and about 35 percent copper/copper oxide. The composite has a compressive strength of at least about 110 ksi.

According to one preferred embodiment of the present invention, the sintered ceramic matrix material has a porosity gradient. That is, the porous ceramic matrix has regions of different porosity. For example, one portion of the ceramic matrix can be substantially 100 percent dense while another portion can have a high porosity, for example about 60 percent or greater. When the porous end is contacted with molten metal, the metal will infiltrate throughout the ceramic porosity, resulting in an article having a dense ceramic portion and a composite portion. The porosity gradient may be a gradual through the material or it may include one or more abrupt changes in porosity, such as a ceramic matrix formed by layers of material having different porosity characteristics. The advantages of a gradient composite material can include the alleviation of the effects of an abrupt thermal expansion gradient, the ability to attach the composite to a variety of materials and the ability to have an article with a dense ceramic surface intimately attached to a composite surface.

The ceramic-metal composites produced according to the present invention are particularly useful as materials for high temperature applications where creep resistance and high toughness are needed, for example, seal faces and the like.

EXAMPLES

Example 1

An evaluation of the performance and wear properties of the metal-infiltrated ceramic material was made by manufacturing a stationary seal from this material and installing it within a typical mechanical face seal assembly. This assembly was then tested through actual use within a typical commercial system.

The commercial system used was a fluid heating unit made by Mokon Div., Protective Closures Co., Inc. This unit is typically used to provide hot water to process manufacturing equipment. The system uses a common water pump assembly containing a mechanical face seal similar to that shown in FIG. 1. The mechanical face seal for the pump in this unit comes supplied with an alumina stationary seal, a VITON™ secondary stationary seal, a graphite rotating seal, and a VITON™ secondary rotating seal.

The test configuration consisted of substituting a metal-infiltrated ceramic stationary seal for the alumina seal. To produce the metal-infiltrated ceramic seal, a composition of 99.5% alumina and organic binders was isostatically pressed into a dense green body. Subsequent green machining processes were performed to yield a green body with a geometry slightly larger than the final component.

The green body component was heated for binder volatilization followed by sintering, resulting in a porous alumina body with a density of approximately 60% of theoretical density.

Infiltration was performed at 1300° C. in a closed system at atmospheric pressure. Sufficient copper/copper oxide was included to substantially completely fill all open porosity through the porous alumina structure. The oxygen content was adjusted to 3 weight percent in relation to the amount of copper.

Figure 3:
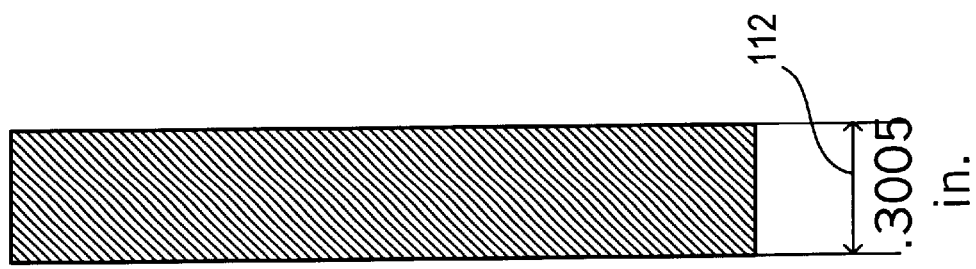
FIG. 3 illustrates a side-view of a typical seal of the present invention.

Following the infiltration process, final machining was performed on the infiltrated part in order to obtain the required dimensions and tolerances for the seal. The dimensions, flatness and roughness of the metal-infiltrated ceramic seal were matched to the original alumina seal that was supplied with the pump. The seal dimensions are shown in FIGS. 2 and 3. The flatness of the seal was controlled to approximately 2 light bands and the target value for the arithmetic mean roughness was 4.

The metal-infiltrated ceramic seal was assembled into the mechanical face seal assembly and installed into the Mokon water pump system. The system was then operated for 1400 hours, continuously pumping a 50/50 mixture of ethylene glycol and water at room temperature. The metal-infiltrated ceramic seal was evaluated for wear through the use of a profilometer and scanning electron microscope (SEM).

Only minimal wear was observed on the metal-infiltrated ceramic stationary seal after 1400 hours of pump operation. There were no apparent macroscopic wear tracks or grooves on the surface of the metal-infiltrated ceramic. There were no leaks or failures within the system.

SEM analysis performed before and after operation showed the formation of slight depressions in the active surface of the metal-infiltrated ceramic seal due to the preferential erosion of copper metal. As discussed previously, these depressions or recesses can act as useful reservoirs for loose wear particles as well as process fluid that can serve as a liquid lubricant.

Profilometer analysis performed on the surface of the metal-infiltrated ceramic seal gave an arithmetic mean roughness (Ra) of 6.7 prior to the water pump testing. Note that the target initial value for Ra was 4, however, the accuracy of the profilometer below an Ra value of 10 was somewhat variable. After 1400 hours of pump operation, the Ra was determined to be 13.7, indicating a slight increase in roughness. These values for Ra were determined by averaging three traces performed at each of four locations on the active seal face. The slight increase in roughness after 1400 hours of operation can be attributed to the formation of recesses in the surface due to the preferential erosion of copper.

Clearly, the metal-infiltrated ceramic seal showed microscopic wear behavior characterized by the preferential erosion of copper from the surface. This erosion did not manifest itself in any form of macroscopic wear tracks or grooves and only "minimal" wear could be detected after 1400 hours of operation. The microscopic recesses formed on the surface of the ceramic metal are expected to provide superior wear performance by acting as reservoirs for loose wear particles and liquid lubricant.

Example 2

Copper-infiltrated alumina face seals were manufactured to commercially available configurations. The parts were tested against commercial 99.5% alumina counterparts in a dual seal test rig. Both parts were lapped and polished to a surface finish of about 4 Ra and a flatness of about 2 light bands, per industry standards. The surface contour was measured on both parts using a laser interferometer before and after the testing. Both parts were rotated on the same shaft and shared the same pressure chamber and pumpant fluids. The first test was conducted using a typical test procedure for evaluation of alumina face seal materials. The test specimens were rotated at about 3495 RPM for 144 hours with water at 80 psi in the pressure chamber. The second test was conducted using the same apparatus but at pressures of 80 psi for the initial 23 hours then increasing the pressure to 110 psi for an additional 25 hours, then increasing the pressure to 120 psi for an additional 120 hours.

The wear groove depths on the first experiment were about 6.5 microinches for the alumina and about 4.5 microinches for the metal-infiltrated ceramic composite material. The Total Indicator Reading (TIR) for both parts decreased during the first experiment: about 29 microinches to about 25 microinches for alumina and about 37 microinches to about 28 microinches for the metal-infiltrated ceramic.

The wear groove on the second experiment was about 22.5 microinches for the alumina and about 25 microinches for the metal-infiltrated ceramic composite. The TIR for the alumina was about 24 microinches initially and about 91 microinches final and about 33 microinches initially for the metal-infiltrated ceramic composite and about 48 microinches for the final TIR. In addition, the grain boundaries were visibly etched in the alumina part at higher pressures and there was visible wear on the carbon mating face, which would likely result in seal failure. The alumina hard face exhibited degradation during the higher pressure test as exhibited by the hard face grain boundary etching and carbon mating ring wear which were not present in the metal-infiltrated ceramic composite hard face and carbon mating ring.

While various embodiments of the present invention have been described in detail, it is apparent that modifications and adaptions of those embodiments will occur to those skilled in the art. However, it is to be expressly understood that such modifications and adaptions are within the spirit and scope of the present invention.

What is claimed is:

1. A seal comprising a metal-infiltrated ceramic, wherein said metal-infiltrated ceramic comprises a sintered ceramic matrix having an interconnected pore structure and said metal is infiltrated into said interconnected pore structure by capillary action.

2. The seal of claim 1, wherein said metal includes oxygen.

3. The seal of claim 1, wherein said metal is selected from the group consisting of copper (Cu), nickel (Ni), aluminum (Al), iron (Fe), stainless steel, titanium (Ti), magnesium (Mg), brass (Cu—Zn), bronze (Cu—Sn), nickel-chromium alloy (Ni—Cr), nickel aluminide (NiAl) and alloys thereof.

4. The seal of claim 1, wherein said metal is selected from the group consisting of nickel, copper, and alloys thereof.

5. The seal of claim 1, wherein said ceramic is selected from the group consisting of alumina ($Al_2O_3$), titania ($TiO_2$), zinc oxide (ZnO), zirconia ($ZrO_2$), iron oxide ($Fe_2O_3$), magnesia (MgO), silica ($SiO_2$), silicon carbide (SiC), silicon nitride ($Si_3N_4$), aluminum nitride (AlN), aluminum titanate ($Al_2TiO_5$) and titanium diboride ($TiB_2$).

6. The seal of claim 1, wherein said ceramic is selected from the group consisting of alumina, aluminum titanate, silicon carbide, zirconia and silicon nitride.

7. The seal of claim 1, wherein the porosity in the ceramic prior to infiltration with metal is from about 15 volume percent to about 85 volume percent.

8. The seal of claim 1, wherein the porosity in the ceramic prior to infiltration with metal is from about 20 volume percent to about 60 volume percent.

9. The seal of claim 1, wherein the porosity in the ceramic prior to infiltration with metal is from about 20 volume percent to about 40 volume percent.

10. The seal of claim 1, wherein said metal-infiltrated ceramic is copper-infiltrated alumina.

11. The seal of claim 1, wherein said metal-infiltrated ceramic is copper-infiltrated silicon carbide.

12. The seal of claim 1, wherein said metal-infiltrated ceramic has a thermal conductivity at 20° C. of at least 50 w/m° K.

13. The seal of claim 1, wherein said seal has a thermal shock resistance of at least Δ200° C.

14. The seal of claim 1, wherein said seal is fit into a receptacle by pressing the seal into the receptacle.

15. The seal of claim 1, wherein said seal is selected from the group consisting of rotary seals, rotary unions, sliding gate seals, bushings, bearings and sliding and rubbing components.

16. The seal of claim 1, wherein said seal is resistant to abrasion.

17. A method for making a seal comprising the steps of:
   a) forming a green body of ceramic material;
   b) sintering said ceramic material to produce a sintered ceramic body having an interconnected porosity of from about 15 volume percent to about 85 volume percent;

c) infiltrating a metal into said sintered ceramic body by capillary action.

18. The method of claim 17, wherein said metal is selected from the group consisting of copper (Cu), nickel (Ni), aluminum (Al), iron (Fe), stainless steel, titanium (Ti), magnesium (Mg), brass (Cu—Zn), bronze (Cu—Sn), nickel-chromium alloy (Ni—Cr), nickel aluminide (NiAl) and alloys thereof.

19. The method of claim 18, wherein said metal is selected from the group consisting of nickel, copper, and alloys thereof.

20. The method of claim 18, wherein said ceramic is selected from the group consisting of alumina ($Al_2O_3$), titania ($TiO_2$), zinc oxide (ZnO), zirconia ($ZrO_2$), iron oxide ($Fe_2O_3$), magnesia (MgO), silica ($SiO_2$), silicon carbide (SiC), silicon nitride ($Si_3N_4$), aluminum nitride (AlN), aluminum titanate ($Al_2TiO_2$) and titanium diboride ($TiB_2$).

21. The method of claim 18, wherein said ceramic is selected from the group consisting of alumina, aluminum titanate, silicon carbide, zirconia and silicon nitride.

22. The method of claim 18, wherein the porosity in the sintered ceramic body prior to infiltration with metal is from about 20 volume percent to about 60 volume percent.

23. The method of claim 18, wherein the porosity in the sintered ceramic body prior to infiltration with metal is from about 20 volume percent to about 40 volume percent.

24. The method of claim 18, wherein said green body is in a near-net shape so that said sintered body approximates the desired final shape of said seal.

25. The method of claim 18, wherein said metal infiltrates said sintered ceramic body at a rate of at least 0.1 centimeters per minute.

* * * * *